(12) United States Patent
Hirata et al.

(10) Patent No.: US 9,884,389 B2
(45) Date of Patent: Feb. 6, 2018

(54) SIC INGOT SLICING METHOD

(71) Applicant: DISCO CORPORATION, Tokyo (JP)

(72) Inventors: Kazuya Hirata, Tokyo (JP); Yoko Nishino, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 273 days.

(21) Appl. No.: 14/850,239

(22) Filed: Sep. 10, 2015

(65) Prior Publication Data

US 2016/0074960 A1  Mar. 17, 2016

(30) Foreign Application Priority Data

Sep. 16, 2014  (JP) .................. 2014-187496

(51) Int. Cl.
| | |
|---|---|
| *B23K 26/00* | (2014.01) |
| *B23K 26/082* | (2014.01) |
| *B28D 5/00* | (2006.01) |
| *B23K 26/53* | (2014.01) |
| *H01L 31/00* | (2006.01) |
| *H01L 21/02* | (2006.01) |
| *B23K 26/70* | (2014.01) |

(Continued)

(52) U.S. Cl.
CPC ...... *B23K 26/0057* (2013.01); *B23K 26/0006* (2013.01); *B23K 26/082* (2015.10); *B23K 26/53* (2015.10); *B23K 26/702* (2015.10); *B28D 5/0005* (2013.01); *H01L 21/02* (2013.01); *H01L 21/0201* (2013.01); *H01L 21/02008* (2013.01); *B23K 2201/40* (2013.01); *B23K 2203/52* (2015.10); *B23K 2203/56* (2015.10)

(58) Field of Classification Search
CPC  B23K 26/0057; B23K 26/0622; B23K 26/53; B23K 26/0006; B23K 2203/56; B28D 5/0011; H01L 31/03926; H01L 31/02008; H01L 31/0504
See application file for complete search history.

(56) References Cited

U.S. PATENT DOCUMENTS

| | | | |
|---|---|---|---|
| 9,620,415 B2* | 4/2017 | Hirata | ............. H01L 21/78 |
| 2003/0141505 A1* | 7/2003 | Isobe | ............. H01L 27/12 |
| | | | 257/66 |

(Continued)

FOREIGN PATENT DOCUMENTS

| | | |
|---|---|---|
| JP | 2004-299969 | 10/2004 |
| JP | 2005-277136 | 10/2005 |
| JP | 2005-294325 | 10/2005 |

*Primary Examiner* — Seahvosh Nikmanesh
(74) *Attorney, Agent, or Firm* — Greer Burns & Crain, Ltd.

(57) ABSTRACT

Disclosed herein is an SiC ingot slicing method including: an initial separation layer formation step for scanning a focal point of a laser beam parallel to an end face of the SiC ingot along a scheduled separation plane, and forming a separation layer at a position at a distance from the end face; a repetition step for sequentially moving, after the initial separation layer formation step, the focal point by the distance equal to the thickness of an SiC plate from the separation layer toward the end face, scanning the focal point parallel to the end face, repeating the formation of the separation layer, and forming the plurality of separation layers; and a separation step for applying an external force to the plurality of separation layers formed by the repetition step, peeling off the SiC plates starting from the separation layers, and acquiring the plurality of SiC plates.

2 Claims, 7 Drawing Sheets

(51) Int. Cl.
 *B23K 103/00* (2006.01)
 *B23K 101/40* (2006.01)

(56) References Cited

U.S. PATENT DOCUMENTS

| | | | |
|---|---|---|---|
| 2012/0055546 A1* | 3/2012 | Turner | B23K 26/073 136/256 |
| 2012/0111495 A1* | 5/2012 | Shimoi | B23K 26/0057 156/250 |
| 2014/0038392 A1* | 2/2014 | Yonehara | H01L 21/304 438/463 |
| 2016/0052090 A1* | 2/2016 | Tanigawa | B23K 26/0624 219/121.69 |
| 2016/0093763 A1* | 3/2016 | Rana | B23K 26/0084 438/57 |
| 2017/0053829 A1* | 2/2017 | Hirata | H01L 21/78 |

* cited by examiner

SIC INGOT SLICING METHOD

BACKGROUND OF THE INVENTION

Field of the Invention

The present invention relates to a method for acquiring SiC plates by slicing an ingot made of SiC.

Description of the Related Art

A cylindrical or prismatic ingot is sliced into a plurality of plate-shaped workpieces. One way to slice an ingot into plate-shaped workpieces is to use a wire saw. For example, when an ingot made of a material such as silicon or glass is cut into individual plate-shaped workpieces using a wire saw, the kerf loss caused by a wire saw (width of the portion removed by the wire saw) amounts to 100 µm to 150 µm. Therefore, a method has been proposed which positions the focal point of a laser beam inside an ingot and scans the focal point, in order to reduce the width of the kerf loss, so as to slice the ingot into plate-shaped workpieces (refer, for example, to Japanese Patent Laid-Open No. 2005-277136).

Here, if the ingot is made of silicon or glass as described above, the area machined with a laser beam, i.e., the sliced cross-section, is machined to a mirror-finished surface. Therefore, laser machining and slicing step are conducted repeatedly to acquire plate-shaped workpieces from an ingot. Laser machining is designed to form a separation layer inside the ingot. Slicing step is designed to slice the ingot into plate-shaped workpieces starting from the separation layer.

SUMMARY OF THE INVENTION

However, if the ingot to be sliced is an SiC ingot, the sliced cross section machined by a laser beam turns into a rough surface similar to the skin of a pear rather than a mirror-finished surface. Therefore, each time an SiC substrate is sliced from an SiC ingot, it is necessary to machine the sliced cross section to a mirror-finished surface, thus resulting in poor work efficiency.

In light of the foregoing, it is an object of the present invention to provide an SiC ingot slicing method that ensures high efficiency in cutting SiC plates from an SiC ingot.

In accordance with an aspect of the present invention, there is provided an SiC ingot slicing method which includes an initial separation layer formation step, a repetition step, and a separation step. The initial separation layer formation step causes a laser beam at a wavelength that transmits through the SiC ingot to enter the SiC ingot from an end face thereof, thus forming a focal point inside the SiC ingot. Then, the initial separation layer formation step scans the focal point in a planar manner along a scheduled separation plane parallel to the end face, thus forming a separation layer at a depth corresponding to the scheduled separation plane. The repetition step sequentially moves, after the initial separation layer formation step, the focal point by a distance equal to a thickness of an SiC plate to be peeled off from the separation layer toward the end face, and scanning the focal point parallel to the end face in a planar manner to thereby form a plurality of separation layers. The separation step applies, after the repetition step, an external force to the plurality of separation layers formed by the repetition step, thus separating the SiC plates starting from the separation layers and acquiring the plurality of SiC plates.

Preferably, the SiC ingot slicing method further includes a surface treatment step for forming, after the separation step, a separation layer remaining on the end face of the SiC ingot, into a surface that permits entry of a laser beam into the SiC ingot.

The SiC ingot slicing method according to the present invention includes the initial separation layer formation step, the repetition step, and the separation step. The initial separation layer formation step positions a focal point at a depth position at a distance from an end face of an SiC ingot, thus forming a separation layer inside the SiC ingot. The repetition step sequentially moves the focal point of a laser beam by a distance equal to a thickness of an SiC plate from the separation layer toward the end face, thus forming a plurality of separation layers inside the SiC ingot. The separation step applies an external force to each of the separation layers, thus acquiring the plurality of SiC plates. This makes it possible to cut the SiC ingot into the plurality of SiC plates, each starting from one of the separation layers formed inside the SiC ingot.

As described above, the focal point of a laser beam is moved from the first separation layer formed toward the end face on the incident side. This reduces the number of times the end face is to be mirror-finished for greater ease with which a laser beam enters the SiC ingot, thus ensuring higher efficiency in cutting the plurality of SiC plates from the SiC ingot.

Preferably, the SiC ingot slicing method further includes a surface treatment step for forming, after the separation step, a separation layer remaining on the end face of the SiC ingot into a face that permits a laser beam to enter the SiC ingot. This contributes to greater ease with which a laser beam enters the SiC ingot when a separation layer is formed on the remaining SiC ingot and slices, thus providing improved work efficiency.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
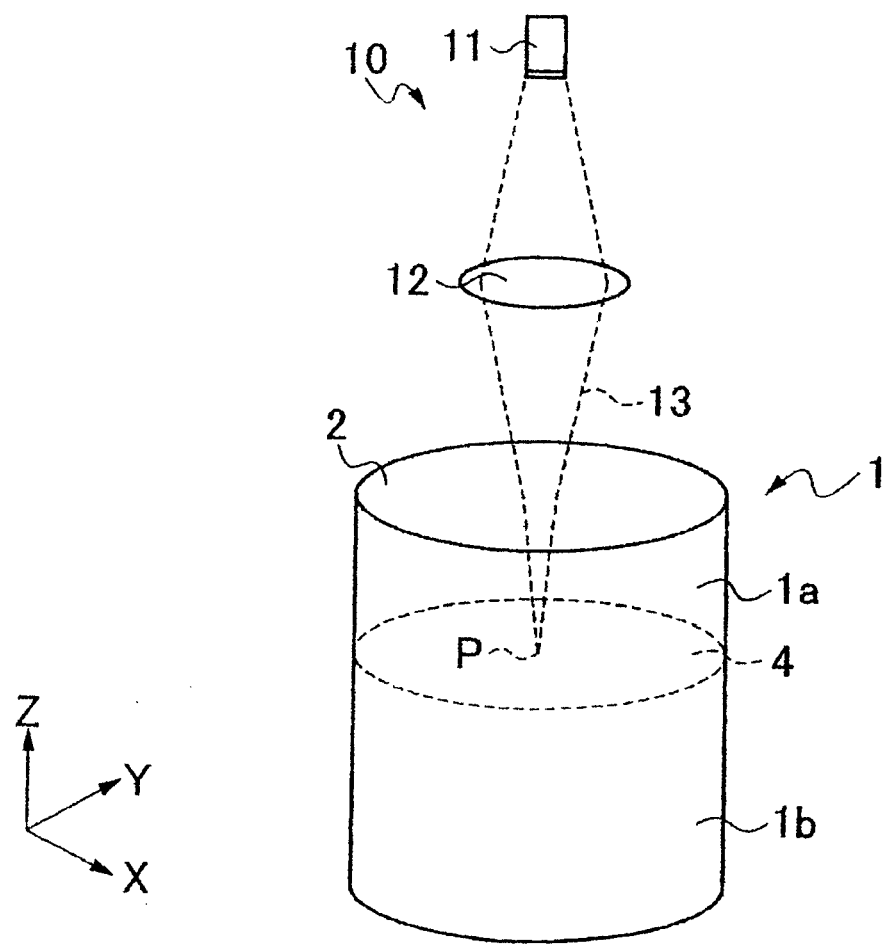
FIG. 1 is a perspective view illustrating an SiC ingot and a configuration of laser irradiation means.

A detailed description will be given below of the method by which an SiC ingot 1 illustrated in FIG. 1 is sliced into a plurality of SiC plates by laser machining. The SiC ingot 1 is an example of a silicon carbide ingot formed in a cylindrical shape.

(1) Initial Separation Layer Formation Step

As illustrated in FIG. 1, a separation layer, a separation start point, is formed inside the SiC ingot 1 by laser irradiation means 10. The laser irradiation means 10 includes a laser oscillator 11 and a condenser 12. The laser oscillator 11 oscillates a laser beam at a wavelength that transmits through SiC. The condenser 12 is arranged below the laser oscillator 11 to focus the laser beam onto a given position inside the SiC ingot 1.

First, the SiC ingot 1 is moved to below the laser irradiation means 10. The laser irradiation means 10 positions a focal point P of the laser beam collected by the condenser 12 at the center at a given depth inside the SiC ingot 1. A scheduled separation plane 4 is a plane where the SiC ingot 1 is to be separated in a direction orthogonal to the Z-axis direction. The scheduled separation plane 4 is set up as a result of positioning of the focal point P.

Although the positioning of the focal point P is not limited to a specific method, the focal point P should preferably be positioned at a depth position as far away from an end face 2 of the SiC ingot 1 as possible in consideration of the focal distance of the condenser 12 and the refractive index of the laser beam to the extent that the laser beam can be collected inside the SiC ingot 1.

Next, the SiC ingot 1 is rotated, and at the same time, the laser irradiation means 10 irradiates a laser beam 13 at a wavelength that transmits through SiC onto the end face 2 of the SiC ingot 1 from the laser oscillator 11. It should be noted that the end face 2 of the SiC ingot 1 is a face on which the laser beam is incident and should preferably be machined to a flat mirror-finished surface to ensure that the entry of the laser beam is not inhibited.

Figure 2:
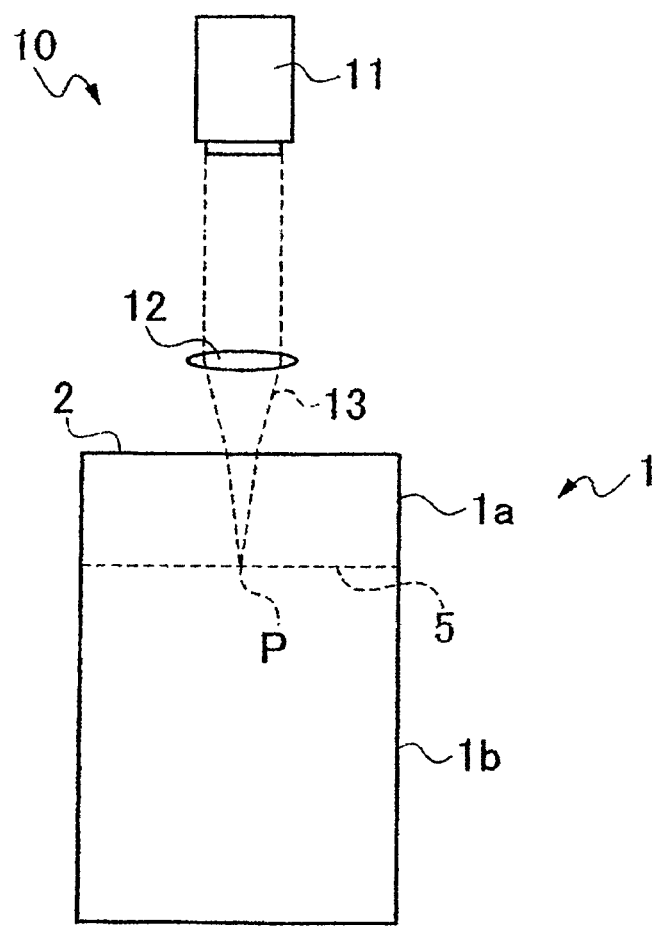
FIG. 2 is a schematic sectional view illustrating an initial separation layer formation step.

The laser irradiation means 10 scans the focal point P in a planar manner along the scheduled separation plane 4 parallel to the end face 2 while at the same time moving the laser oscillator 11 in the direction of the diameter of the SiC ingot 1, moving the laser beam 13 focused onto the focal point P from the center of the rotating SiC ingot 1 toward the outer circumference thereof and irradiating the laser beam 13 onto the scheduled separation plane 4 parallel to the end face 2. As a result, a separation layer 5 parallel to the end face 2 is formed inside the SiC ingot 1 as illustrated in FIG. 2.

As the first separation layer 5 is formed inside the SiC ingot 1 as described above, the portion of the SiC ingot 1 above the separation layer 5 is configured as a first ingot 1a which should form a plurality of separation layers through the repetition step which will be described later. On the other hand, the portion of the SiC ingot 1 below the separation layer 5 is configured as a second ingot 1b which will be sliced in the same manner as the first ingot 1a after the slicing of the first ingot 1a.

In the initial separation layer formation step, for example, the separation layer 5 may be formed inside the SiC ingot 1 by maintaining the laser irradiation means 10 in place and relatively moving the SiC ingot 1 sequentially in the X-axis and Y-axis directions in addition to forming the separation layer 5 by moving the laser irradiation means 10 in the direction of the diameter of the SiC ingot 1 while at the same time rotating the SiC ingot 1 illustrated in FIG. 1.

(2) Repetition Step

Figure 3A:
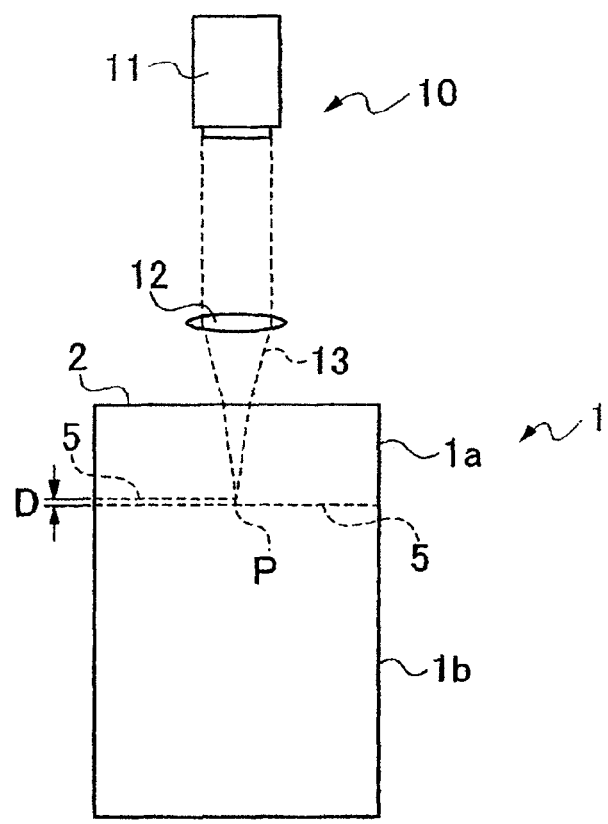
FIGS. 3A and 3B are schematic sectional views illustrating a repetition step.
Figure 3B:
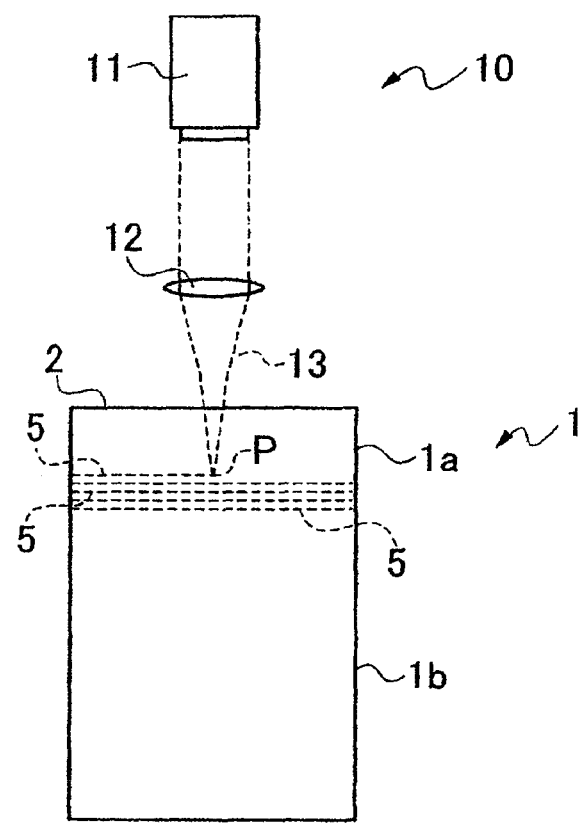

After the initial separation layer formation step, a plurality of separation layers similar to the separation layer 5 formed by the initial separation layer formation step are formed inside the first ingot 1a as illustrated in FIGS. 3A and 3B. More specifically, the laser irradiation means 10 moves the focal point P of the laser beam 13 from the separation layer 5 toward the end face 2 of the SiC ingot 1 by a given distance. The term "given distance" refers to a distance equal to a thickness D of a single SiC plate to be acquired by slicing the first ingot 1a. The thickness D of a single SiC plate is set to be, for example, 1 mm.

Next, the focal point P that has been moved toward the end face 2 by the distance equal to the thickness D is scanned parallel to the end face 2, and irradiating the laser beam 13 into the first ingot 1a in a manner parallel to the end face 2 of the laser beam 13 to thereby form the separation layer 5. The formation of the separation layer 5 parallel to the end face 2 is repeated while at the same time moving the focal point P toward the end face 2 by the distance equal to the thickness D as illustrated in FIG. 3B, thus forming the plurality of separation layers 5 inside the first ingot 1a. The kerf loss formed as described above in the case of laser machining (thickness of the separation layer 5) is about 10 μm which is smaller than that when an SiC ingot is sliced by a wire saw, thus providing improved work efficiency during the separation step which will be described later.

(3) Separation Step

Figure 4:
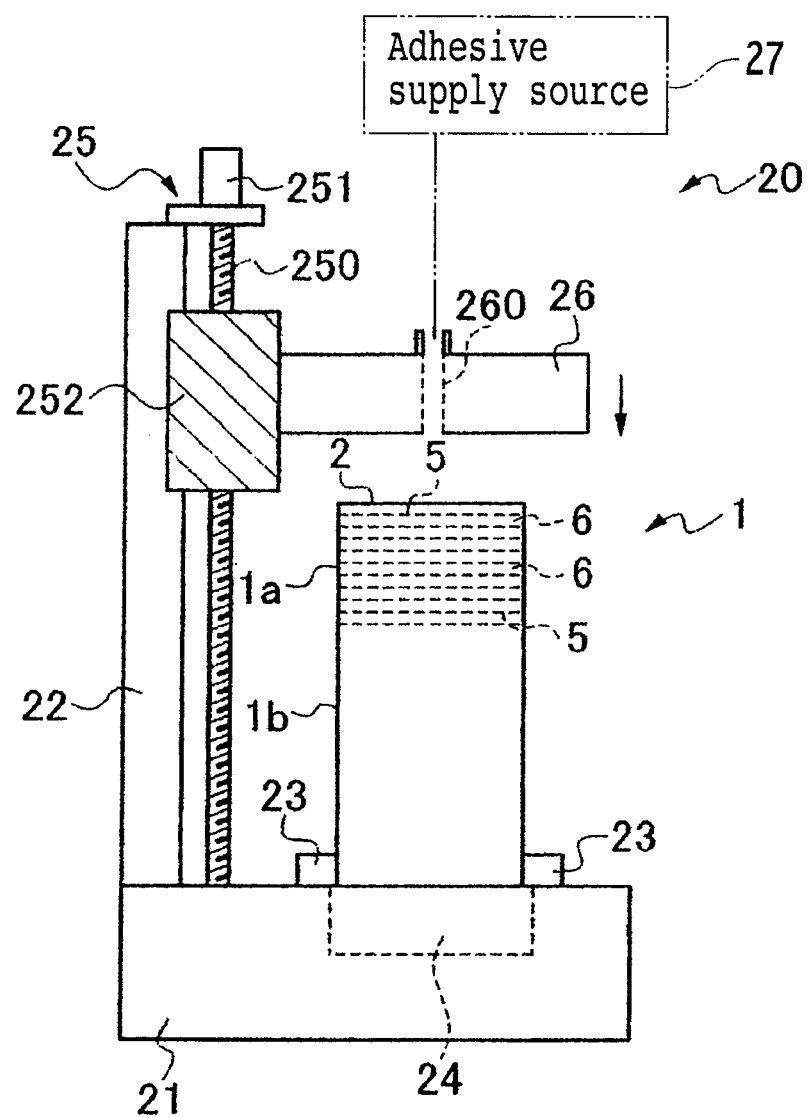
FIG. 4 is a schematic sectional view illustrating that peeling means is brought close to an SiC ingot in a separation step.

After the repetition step, an external force (e.g., bonding force and pressing force) is applied to the plurality of separation layers 5 formed by the repetition step using peeling means 20 illustrated in FIG. 4, thus separating SiC plates 6 starting from the separation layers 5 and acquiring the plurality of SiC plates 6 from the first ingot 1a. The peeling means 20 includes a worktable 21 and an upright base 22. The SiC ingot 1 is placed on the worktable 21. The upright base 22 is provided upright on the top face of the worktable 21. A holding block 23 is arranged on the worktable 21 to hold the SiC ingot 1, allowing the SiC ingot 1 to be held and secured. Further, rotating means 24 is embedded in the worktable 21 to rotate the SiC ingot 1 in a given direction.

A holding section 26 is provided on the lateral portion of the upright base 22 via ascending/descending means 25 to peel off the SiC plates. A supply hole 260 is formed in the holding section 26, with an adhesive supply source 27 connected to the supply hole 260. The ascending/descending means 25 includes a ball screw 250, a motor 251, and an ascending/descending section 252. The ball screw 250 extends parallel to the upright base 22. The motor 251 is connected to one end of the ball screw 250. The ascending/descending section 252 has one end in sliding contact with the upright base 22 and the other end coupled to the holding section 26. A nut is formed inside the ascending/descending section 252 and screwed onto the ball screw 250. Then, the holding section 26 can be raised or lowered together with the ascending/descending section 252 as the motor 251 rotates the ball screw 250.

When the plurality of SiC plates 6 are acquired from the first ingot 1a using the peeling means 20, the SiC ingot 1 is placed on the worktable 21 and secured in place with the holding block 23 first as illustrated in FIG. 4.

Figure 5:
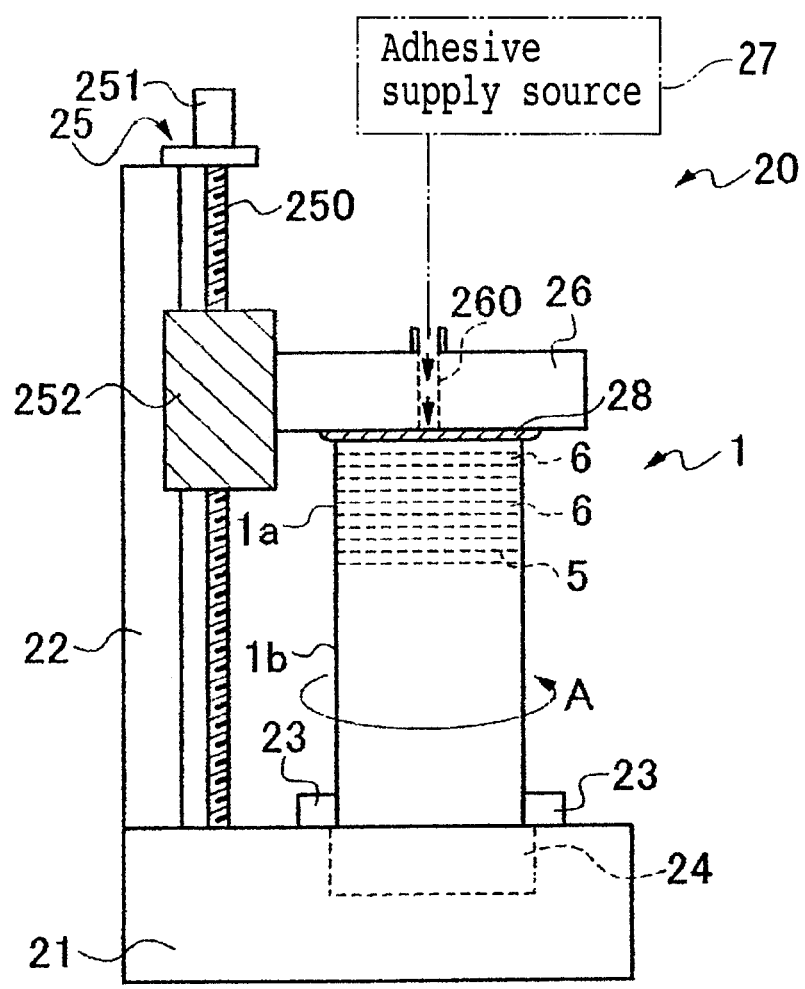
FIG. 5 is a schematic sectional view illustrating that an adhesive is applied to an SiC plate in the separation step.

Next, the ascending/descending means 25 lowers the holding section 26 in the direction of approaching the end face 2 of the SiC ingot 1 together with the ascending/descending section 252. Next, the holding section 26 stops lowering immediately before coming in contact with the end face 2, allowing an adhesive 28 to flow into the supply hole 260 from the adhesive supply source 27 and fastening the uppermost SiC plate 6 of the first ingot 1a to the holding section 26 via the adhesive 28 as illustrated in FIG. 5.

Figure 6:
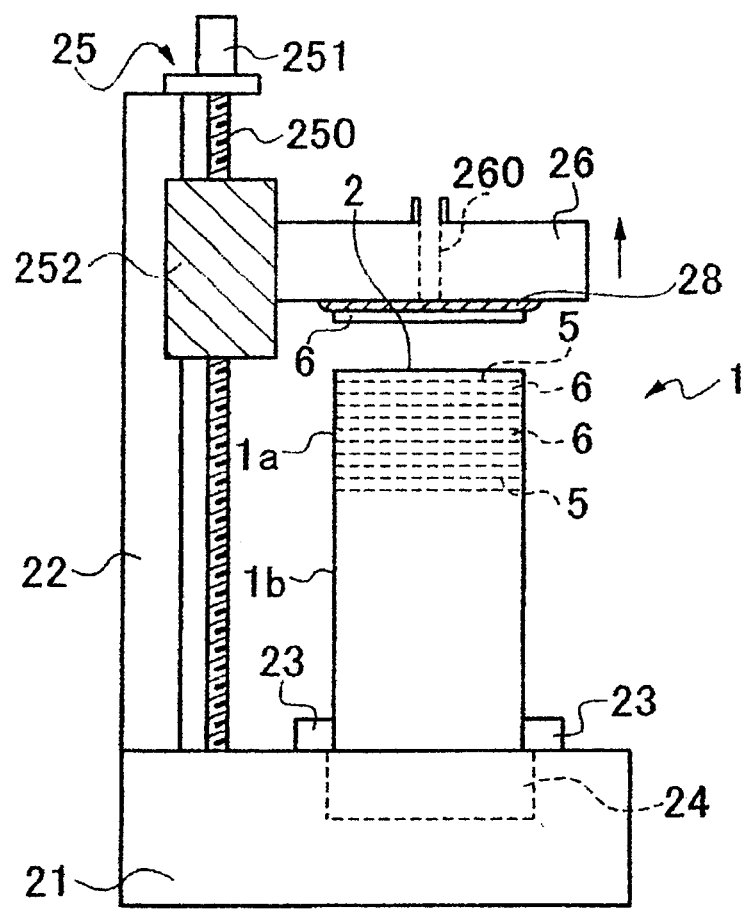
FIG. 6 is a schematic sectional view illustrating that an SiC plate is separated starting from a separation layer in the separation step.

When the holding section 26 holds the SiC ingot 1 via the adhesive 28, the ascending/descending means 25 raises the holding section 26 as illustrated in FIG. 6, thus peeling off the single SiC plate 6 from the first ingot 1a starting from the separation layer 5. At this time, the rotating means 24 should preferably be activated to rotate the SiC ingot 1, for example, in the direction of an arrow A as illustrated in FIG. 5, thus making it easy to separate the separation layer 5. Then, the same peeling action as described above is repeated on the next SiC plate 6. Then, all the separation layers 5 are separated, thus acquiring the plurality of SiC plates 6 from the first ingot 1a.

It should be noted that, in the separation step, the separation layers 5 may be separated by applying a pressing force to the lateral face of the SiC ingot 1 using pressing means which is not shown so as to acquire the plurality of SiC plates 6 from the first ingot 1a.

(4) Surface Treatment Step

Figure 7:
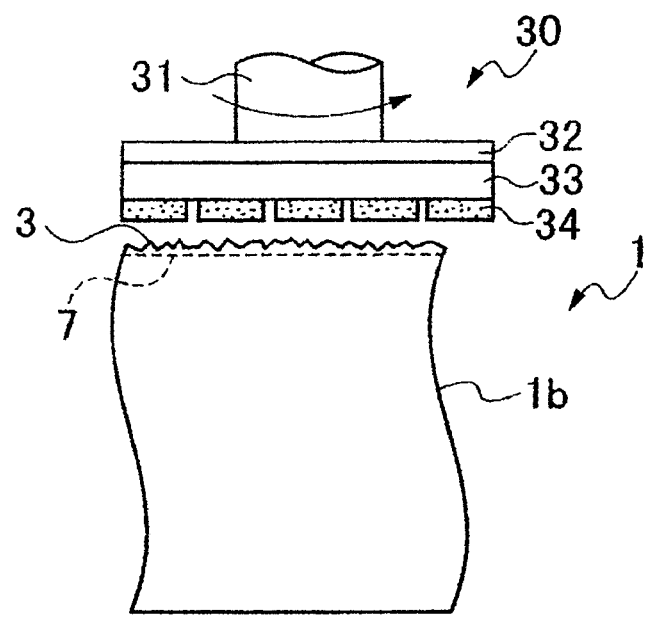
FIG. 7 is a schematic sectional view illustrating a first example of a surface treatment step.

After the separation step, projections and depressions are formed on an end face 3 of the second ingot 1b illustrated in FIG. 7. Therefore, the end face 3 is subjected to a desired type of grinding using, for example, grinding means 30. The grinding means 30 includes a rotatable spindle 31 and a grinding wheel 33. The grinding wheel 33 is attached to the lower end of the spindle 31 via a mount 32 and has a plurality of grindstones 34. The grindstones 34 are fastened, in an annular manner, to the lower portion of the grinding wheel 33.

The grinding means 30 rotates the grinding wheel 33 as the spindle 31 rotates, lowering the grinding wheel 33 toward the end face 3 of the second ingot 1b. Next, the grinding means 30 grounds the end face 3 to a flat machined face 7 shown by a dotted line while at the same time pressing the end face 3 of the second ingot 1b with the rotating grindstones 34, thus removing the projections and depressions and flattening the end face 3. This ensures that a laser beam properly enters the machined face 7 when the second ingot 1b is subjected to the initial separation layer formation step and the repetition step described above, thus allowing the laser beam to be focused onto a desired focal point and the second ingot 1b to be sliced properly.

Figure 8:
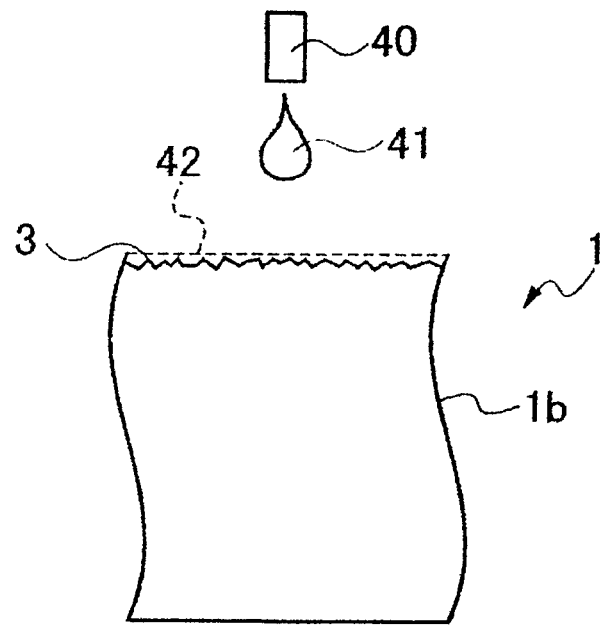
FIG. 8 is a schematic sectional view illustrating a second example of the surface treatment step.

Further, a flat liquid surface 42 may be formed on the end face 3 as illustrated in FIG. 8 rather than grinding the end face 3, thus allowing the laser beam 13 to enter into the second ingot 1b. In order to form the flat liquid surface 42, a liquid 41 having a refractive index close to that of SiC is dripped from a liquid supply section 40 onto the end face 3 of the second ingot 1b. The liquid supply section 40 is arranged above the SiC ingot 1. Further, the end face 3 of the second ingot 1b may be mirror-finished using, for example, a grinding wheel, thus forming a flat machined surface.

As described above, the SiC ingot slicing method illustrated in the present embodiment forms the first separation layer 5 by positioning the focal point P of the laser beam 13 at a position at a distance from the end face 2 of the SiC ingot 1 in the initial separation layer formation step. This is followed by the repetition step in which the focal point is sequentially moved by the distance equal to the thickness D of the SiC plate toward the end face 2 so as to form the plurality of separation layers 5 inside the SiC ingot 1, after which the separation step is performed. As a result, it is possible to acquire the plurality of SiC plates 6 from the SiC ingot 1 with high efficiency.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A silicon carbide (SiC) ingot slicing method comprising:
    an initial separation layer formation step for causing a laser beam at a wavelength that transmits through the SiC ingot to enter the SiC ingot from an end face thereof, forming a focal point inside the SiC ingot, scanning the focal point in a planar manner along a scheduled separation plane parallel to the end face to thereby form a separation layer at a depth corresponding to the scheduled separation plane;
    a repetition step for sequentially moving, after the initial separation layer formation step, the focal point by a distance equal to a thickness of an SiC plate to be peeled off from the separation layer toward the end face, scanning the focal point parallel to the end face in a planar manner to thereby form a plurality of separation layers; and
    a separation step for applying, after the repetition step, an external force to the plurality of separation layers formed by the repetition step, separating the SiC plates starting from the separation layers, and acquiring the plurality of SiC plates.

2. The SiC ingot slicing method of claim 1, further comprising:
    a surface treatment step for forming, after the separation step, a separation layer remaining on the end face of the SiC ingot, into a surface that permits entry of a laser beam into the SiC ingot.

* * * * *